United States Patent
Kagerhuber et al.

(10) Patent No.: US 11,978,977 B2
(45) Date of Patent: May 7, 2024

(54) HIGH CURRENT CONTACT FOR CONTACTING A HIGH CURRENT SOCKET

(71) Applicants: LISA DRÄXLMAIER GMBH, Vilsbiburg (DE); PTR HARTMANN GMBH, Werne (DE)

(72) Inventors: Manuel Kagerhuber, Gangkofen (DE); Anton Mayer, Seyboldsdorf (DE); Andreas Briesemann, Lünen (DE)

(73) Assignee: LISA DRÄXLMAIER GMBH, Vilsbiburg (DE)

( * ) Notice: Subject to any disclaimer, the term of this patent is extended or adjusted under 35 U.S.C. 154(b) by 629 days.

(21) Appl. No.: 17/256,179

(22) PCT Filed: Jun. 29, 2018

(86) PCT No.: PCT/EP2018/067563
§ 371 (c)(1),
(2) Date: Dec. 25, 2020

(87) PCT Pub. No.: WO2020/001782
PCT Pub. Date: Jan. 2, 2020

(65) Prior Publication Data
US 2022/0302628 A1    Sep. 22, 2022

(51) Int. Cl.
*H01R 13/05* (2006.01)
*H01R 13/502* (2006.01)
(Continued)

(52) U.S. Cl.
CPC ........ *H01R 13/502* (2013.01); *H01R 13/052* (2013.01); *H01R 13/6683* (2013.01);
(Continued)

(58) Field of Classification Search
CPC ............... H01R 13/502; H01R 13/052; H01R 13/6683; H01R 13/03; G01K 7/00; G01R 1/04
See application file for complete search history.

(56) References Cited

U.S. PATENT DOCUMENTS 4,644,118 A * 2/1987 Gengenbach .......... H01H 1/385
                                                    218/146
5,473,303 A * 12/1995 Hohider ............... H01H 37/765
                                                    337/407
(Continued)

FOREIGN PATENT DOCUMENTS

DE    102011056798 A1 *  6/2013  ............ F01K 13/02
DE    102014114141 A1    3/2016
(Continued)

OTHER PUBLICATIONS

WO2012136562 English Language Translation.
WO0213330 English Language Translation.
DE102014114141 English Language Translation.

*Primary Examiner* — Dominic E Hawkins
(74) *Attorney, Agent, or Firm* — BelayIP

(57) ABSTRACT

A high current contact is disclosed having a contact pin for insertion into the high-current socket having a plurality of contact segments that are slotted in a radial direction for contacting an inner contact surface of the high-current socket; a guide sleeve surrounding the contact pin, which, by means of an at least central front pressing against the high-current socket relative to the contact pin in an axial direction from an initial position, in which the guide sleeve blocks an independent radial spreading of the contact segments in order to avoid a contact between the contacts segments protruding axially from the guide sleeve and the inner contact surface, is movable into a contact position that is set back with respect to the contact pin and in which the guide sleeve unblocks an independent radial spreading of the contact segments protruding from the guide sleeve for contacting the inner contact surface.

11 Claims, 3 Drawing Sheets

(51) Int. Cl.
  *H01R 13/66* (2006.01)
  *G01K 7/00* (2006.01)
  *G01R 1/04* (2006.01)
  *H01R 13/03* (2006.01)

(52) U.S. Cl.
  CPC .............. *G01K 7/00* (2013.01); *G01R 1/04* (2013.01); *H01R 13/03* (2013.01)

(56) References Cited

U.S. PATENT DOCUMENTS

| | | | | |
|---|---|---|---|---|
| 8,876,553 | B2* | 11/2014 | Lu | H01R 9/05 |
| | | | | 439/584 |
| 9,653,831 | B2* | 5/2017 | Hoyack | H01R 12/91 |
| 2016/0211590 | A1* | 7/2016 | Saur | H01R 13/187 |
| 2016/0315033 | A1* | 10/2016 | Otremba | H01L 23/49524 |
| 2017/0082655 | A1* | 3/2017 | Rosenberg | G01R 1/0416 |
| 2017/0160311 | A1* | 6/2017 | Unokuchi | G01R 1/067 |
| 2020/0266577 | A1* | 8/2020 | Schnieder | H01R 13/5025 |
| 2021/0005995 | A1* | 1/2021 | Mangstl | H01R 13/17 |

FOREIGN PATENT DOCUMENTS

| | | | |
|---|---|---|---|
| JP | S57161876 | 10/1982 | |
| WO | WO0213330 A1 | 2/2002 | |
| WO | WO-2012136562 A1 * | 10/2012 | ......... G01R 1/06722 |
| WO | WO2012136562 A1 | 10/2012 | |

* cited by examiner

HIGH CURRENT CONTACT FOR CONTACTING A HIGH CURRENT SOCKET

CROSS REFERENCE TO RELATED APPLICATIONS

This application is a national phase application of International Application No. PCT/EP2018/067563, filed on Jun. 29, 2018, the content of which is incorporated herein by reference.

BACKGROUND OF THE INVENTION

The present disclosure relates to high-current contact for contacting a high-current socket.

In particular, due to the increasing electrification of motor vehicles, it is increasingly necessary to connect high-current contacts with high-current sockets for functional testing and/or for test purposes for example in so-called end-of-line-tests in the production of high-voltage components for motor vehicles. Very high-current, sometimes of more than 1000 amperes, flow at least for a short time via such high-current sockets. Continuous currents of about 500 amperes are not uncommon. Such high-current contacts of this type, which have to be connected to high current sockets for testing a wide variety of electrical components, must be able to withstand very high-currents on the one hand and, on the other hand, must be able to withstand very many mating cycles during ongoing production or test operation.

BRIEF SUMMARY OF THE INVENTION

It is therefore a task of the present disclosure to provide a high-current contact for contacting a high-current socket which is suitable for a large number of test cycles and high currents.

This problem is solved by a high-current contact for contacting a high-current socket with the features of claim 1. Advantageous embodiments with appropriate and non-trivial developments of the invention are specified in the dependent claims.

The high-current contact for contacting a high-current socket according to the invention comprises a contact pin for insertion into the high-current socket having a plurality of contact segments slotted in a radial direction for contacting an inner contact surface of the high-current socket. The contact segments, which are slotted in the radial direction, are preloaded in the radial direction. This means that the contact segments of the contact pin are conically expanded in relation to a longitudinal axis of the contact pin without the application of external force.

The high-current contact also comprises a guide sleeve surrounding the contact pin which can be moved in the axial direction from the initial position to a contact position that is set back in relation to the contact pin by pressing the high-current socket at least indirectly on the front side. The guide sleeve is configured in such a way that, in the initial position, the guide sleeve blocks independent radial spreading of the contact segments in order to avoid contact between the contact segments protruding axially from the guide sleeve and the inner contact surface. In the contact position that is set back from the contact pin, the guide sleeve produces an independent radial spreading of the contact segments protruding radially from the guide sleeve for contacting the inner contact surface of the high-current socket.

To establish an electrically conductive contact between the high-current contact and the high-current socket, the high-current contact only has to be pressed against the high-current socket on the front side. In the force-free or mechanically unloaded state, the guide sleeve is automatically in the initial position in which the guide sleeve blocks independent radial expansion of the contact segments. Thus, in the initial position, a maximum outer diameter of the contact segments of the contact pin is smaller than an inner diameter of the high-current socket. As a result, the contact pin and its contact segments can be inserted into the high-current socket without touching the inner contact surface thereof. During this introduction process, the high-current socket exerts a pressure or a force on the guide sleeve at least indirectly at the front end. As a result, the guide sleeve is displaced relative to the contact segments of the contact pin from the initial position to the reset contact position. This recessed contact position corresponds to a kind of end position or final position in which electrical contact is made between the high-current contact and the high-current socket. Because the slotted contact segments of the contact pin are preloaded in the radial direction, they move outwards in the radial direction without external force. In the reset contact position of the guide sleeve, the guide sleeve releases an independent radial spreading of the contact segments that protrude axially from the guide sleeve. As a result, the contact segments of the contact pin spread radially outwards to such an extent that they come into contact with the internal contact surface of the high-current socket. As a result, reliable contacting is achieved between the high-current contact and the high-current socket.

The slotted contact segments of the contact pin thus act like a kind of collet chuck which can be radially expanded when inserted into the high-current socket. When the high-current contact moves in and out of the high-current socket, the high-current contact thus only makes contact on the end face with the high-current socket serving as the test object. When the contact segments are moved in and out of the high-current socket, the contact segments rubbing or grinding on the inner surface of the high-current socket can thereby be avoided. Damage to the surface of the internal contact surface or damage to the contact segments can thus be avoided. In particular, the high-current contact can be used for a plurality of mating cycles for checking a plurality of high-current sockets without affecting the contact segments and the respective inner contact surfaces of the high-current sockets to be tested. In other words, the high-current contact according to the invention enables the high-current socket to be contacted without damage.

In addition, a test line for measuring at least one physical property opens into at least one contact area of the contact segments. The physical property is preferably an electrical resistance and/or a temperature. Thus, by means of the high-current contact according to the invention, it is possible to measure a resistance and/or a temperature in at least one contact area of the contact segments. Only a perfect contacting of the high-current socket guarantees a high quality and reproducible measurement. This can be monitored via the resistance measurement. Furthermore, very high temperatures can occur due to the high possible currents between the high-current contact and the high-current socket. A temperature measurement in the contact area can ensure that too high temperatures do not occur which could damage the high-current contact and/or the high-current socket.

An advantageous embodiment of the present disclosure provides that, in at least one contact area of the contact segments, a sensor means for measuring at least one physical property is arranged and connected to the test line. The physical property may be a temperature and/or a resistance. Thus, it can be a sensor means for resistance measurement and/or temperature measurement, wherein the sensor means is designed to transmit the measurement data representing resistance measurement and/or the measurement data representing temperature measurement to a higher-level control unit via the test line.

An advantageous embodiment of the present disclosure provides that the guide sleeve has a conical inner section, which interacts with a conical outer section of the contact pin when the guide sleeve is moved from the initial position to the reset contact position, thereby releasing the independent spreading of the contact segments. The matched conical sections in the form of the inner section of the guide sleeve and the conical outer section of the contact pin thus enable controlled radial spreading of the contact segments in a reliable manner.

A further advantageous embodiment of the present disclosure provides that the guide sleeve is axially and movably mounted in a housing part with the interposition of a return spring, which exerts a return force on the guide sleeve in the direction of the initial position. When the contact pin is moved into the high-current socket, the return spring thus exerts a counterforce. If no more force is applied to the high-current contact after it has been inserted into the high-current socket, the return spring ensures that the guide sleeve is moved back to its initial position. When the high-current contact is pulled out of the high-current socket, it can be ensured that the contact segments are pressed together again, radially, due to the movement of the guide sleeve, as a result of which there is no longer any contact between the contact segments and the inner contact surface of the high-current socket when the contact pin is pulled out of the high-current socket.

According to another advantageous embodiment of the present disclosure, the contact pin is connected to the guide sleeve by means of a spring. If the contact pin is accidentally pushed against the contact pin, for example when attempting to insert the contact pin into the high-current socket, the spring ensures that the contact pin is pressed into the guide sleeve. As a result, damage to the contact pin can be avoided.

In a further advantageous embodiment of the present disclosure, it is provided that the contact pin has a radially and outwardly extending collar which prevents movement of the guide sleeve from the retracted contact position beyond the initial position. Relative movement of the guide sleeve beyond the initial position can thus be reliably prevented. Consequently, the contact pin always remains reliably inside the guide sleeve.

A further advantageous embodiment of the present disclosure provides that a nut with a front-face contact surface for the high-current socket is screwed onto the guide sleeve, it being possible, by changing the axial position of the nut, to change the recessed contact position of the guide sleeve and thus the contact force which can be exerted on the inner contact surface of the high-current socket by means of the contact segments. For axial position change, the nut simply has to be twisted so that it moves along the high-current socket in the axial direction. Depending on the positioning of the nut, the reset contact position of the guide sleeve is modified. The further the slotted contact segments can project out of the guide sleeve in the axial direction, the less the guide sleeve inhibits the independent or autonomous spreading of the contact segments. In this way, the exercisable contact force of the contact segments on the inner contact surface of the high-current socket can be varied.

According to another advantageous embodiment of the present disclosure, a sensor means for measuring resistance is arranged in the at least one contact area of the contact segments and is connected to the test line, wherein the sensor means is designed to transmit measurement data representing the resistance measurement via the test line to a superordinate control unit. The sensor means is preferably mounted in a resilient manner, for example by being mounted on a silicone bed which can be elastically deformed. Using this sensor means, a four-wire or kelvin measurement can be carried out on the inserted contact pin. The four-wire measurement is used for the measurement of electrical resistances with a four-wire connection or circuit if line and connection resistances could falsify the measurement. In the four-wire measuring arrangement, a known electric current flows through the resistance via two of the lines. The voltage dropping at the resistor is tapped at high impedance via two further lines and measured with a voltmeter. The resistance to be measured is calculated from this according to Ohm's law. The principle applies analogously with the current measurement by means of a low-impedance shunt. Here, the unknown current through a known resistor is determined by means of the falling voltage. In four-wire or Kelvin measurement, the lead resistances of the measuring lines and the contact resistances at the measuring points between the high-current socket and the measuring instrument are compensated. The same principle applies to the use of capacitance or inductance measurements. Only a perfect contacting of the high current socket guarantees a high quality and reproducible measurement. In order to keep up with the constantly growing technical development, the requirements for the contacting of the high-current socket must be constantly adapted. The sensor means is connected to the test line by connection means and measured data is sent to a control unit via the test line and evaluated there. The sensor means is preferably adapted to measure electrical resistances of the high-current socket.

A further advantageous embodiment of the present disclosure provides that a sensor means for temperature measurement is arranged in at least one contact area of the contact segments and is connected to the test line, the sensor means being designed to transmit measurement data representing the temperature measurement to the higher-level control unit or a further control unit via the test line. Preferably, this sensor means is a temperature sensor which is in contact with at least one contact area of the contact segments. By means of this further sensor means, in particular the temperature inside the high-current contact can be measured. When checking the high-current socket by means of the high-current contact, continuous currents of approximately 500 amperes and peak currents of 1000 amperes can occur. The high-current contact and the high-current socket can become very hot. By means of the sensor means for temperature measurement, respective temperatures at the high current contact and the high current socket can be reliably monitored. For both types of test lines, i.e. for resistance measurement and for temperature measurement, the contact pin can have respective grooves in which respective test lines are arranged. This allows the test lines to be routed in the axial direction along the contact pin, for example, to an end facing away from the contact segments.

According to a further advantageous embodiment of the present disclosure, it is provided that the contact pin comprises a coolant bore for supplying a gaseous cooling medium to the contact segments. For example, the coolant bore may extend along the entire longitudinal axis of the contact pin. In this way, the gaseous cooling medium, for example in the form of compressed air or the like, can be supplied to the contact segments in a simple manner if required. If high currents flow between the high-current contact and the connected high-current socket, the contact segments can be reliably cooled.

In a further advantageous embodiment of the present disclosure, it is provided that the contact pin has a connection for supplying the gaseous cooling medium on its longitudinal end facing away from the contact segments. In this way, the gaseous cooling medium can be supplied to the coolant bore and ultimately to the contact segments in a particularly simple manner.

Finally, another advantageous embodiment of the present disclosure provides that the high-current contact comprises a nickel-silver coating. This helps to increase the service life of the high-current contact and improve the electrical contact between the high-current contact and the high-current socket.

Further advantages, features and details of the present disclosure result from the following description of preferred embodiments and drawings. The characteristics and combinations of features mentioned above in the description, as well as the characteristics and combinations of features listed below in the description of figures and/or shown in the figures alone, are not limited to the combination indicated in each case; but can also be used in other combinations or on their own without leaving the scope of the invention.

BRIEF DESCRIPTION OF THE SEVERAL VIEWS OF THE DRAWINGS

Further advantages features and details of the various embodiments of this disclosure will become apparent from the ensuing description of a preferred exemplary embodiment or embodiments and further with the aid of the drawings. The features and combinations of features recited below in the description, as well as the features and feature combination shown after that in the drawing description or in the drawings alone, may be used not only in the particular combination recited but also in other combinations on their own without departing from the scope of the disclosure.

In the following, advantageous examples of the invention are set out with reference to the accompanying drawings, wherein.

DETAILED DESCRIPTION OF THE INVENTION

As used throughout the present disclosure, unless specifically stated otherwise, the term "or" encompasses all possible combinations, except where infeasible. For example, the expression "A or B" shall mean A alone, B alone, or A and B together. If it is stated that a component includes "A, B, or C", then, unless specifically stated otherwise or infeasible, the component may include A, or B, or C, or A and B, or A and C, or B and C, or A and B and C. Expressions such as "at least one of" do not necessarily modify an entirety of the following list and do not necessarily modify each member of the list, such that "at least one of "A, B, and C" should be understood as including only one of A, only one of B, only one of C, or any combination of A, B, and C.

In the figures, the same or functionally identical elements have been provided with the same reference signs.

Figure 1:
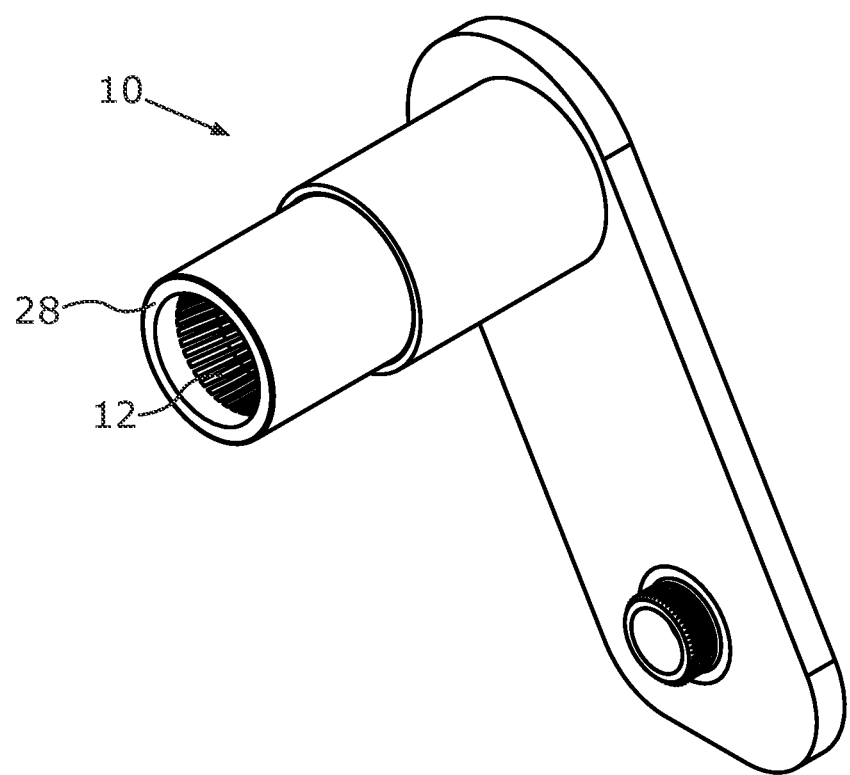
FIG. 1 depicts a perspective view of a high-current socket having an inner contact surface for electrically conductive contact with a high-current contact.

A high current socket 10 is shown in a perspective view in FIG. 1. The high-current socket 10 includes an inner contact surface 12 for electrically conductive contact with a high-current contact 14 (not shown here). The high-current socket 10 may be installed on a wide variety of components, such as a so-called s-box for an electrically driven motor vehicle. In order to ensure the reliable functioning of the high-current socket 10, it may be provided, for example, in a so-called end-of-line test, to test it by means of the high-current contact 14. Very high currents are possible, for example of more than 1000 amperes, at least for a short time. In addition, continuous currents of approximately 500 amperes can occur during the test procedure.

Figure 2:
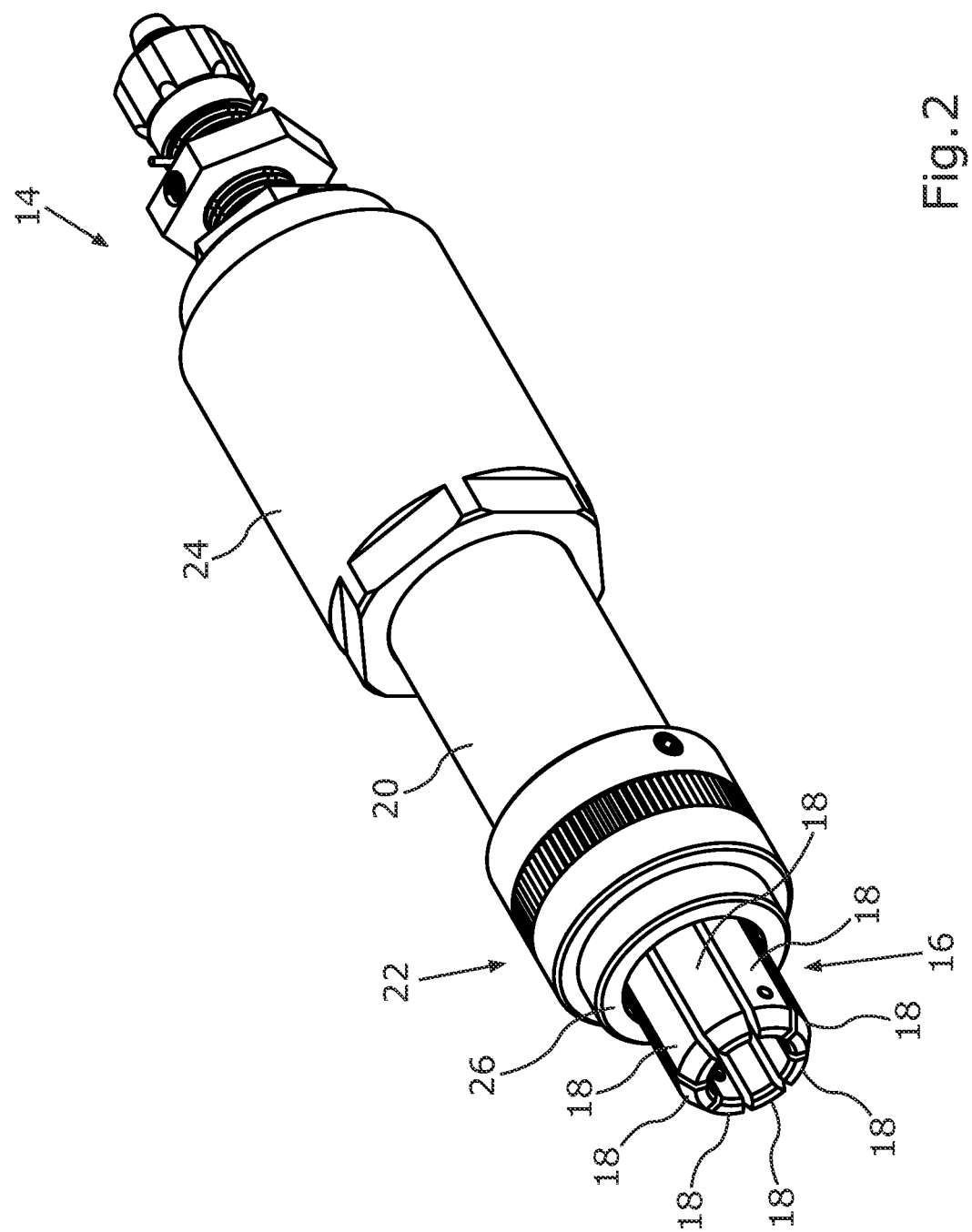
FIG. 2 depicts a perspective view of the high-current contact for contacting the high-current socket, the high-current contact having a contact pin for insertion into the high-current socket with a plurality of contact segments slotted in the radial direction for contacting the inner contact surface of the high-current socket and a guide sleeve surrounding the contact pin, from which the guide sleeve partially protrudes the contact segments.

In FIG. 2, the high current contact 14 for contacting the high current socket 10 is shown in a perspective view. The high-current contact 14 is preferably produced from a highly conductive copper alloy. In addition, the high-current contact 14 can be provided with a nickel-silver coating, for example, in order to increase the service life and to optimize the electrical contact between the high-current contact 14 and the high-current socket 10.

The high-current contact 14 comprises a contact pin 16 for insertion into the high-current socket 10, having a plurality of contact segments 18 slotted in the radial direction for contacting the inner contact surface 12 of the high-current socket 10. The slotted contact segments 18 are prestressed in the radial direction. This means that in the mechanically unloaded state, the contact segments 18 would bend up radially outwardly, so that the contact segments 18 would form a type of cone shape.

The high-current contact 14 further comprises a guide sleeve 20 surrounding the contact pin 16. A nut 22 is screwed onto the guide sleeve 20 and the guide sleeve 20 is mounted in an axially movable manner in a housing part 24. In order to contact the high-current contact 14 with the high-current socket 10, the contact pin 16 is inserted into the high-current socket 10. A front contact surface 26 of the nut 22 comes into contact with a front contact surface 28 of the high-current socket 10. If the high-current contact 14 is now pressed further onto the high-current socket 10, the guide sleeve 20 is shifted backwards relative to the contact pin 16 due to the contact between the front contact surfaces 26 and 28.

The guide sleeve 20, which is axially and movably mounted within the housing part 24, can thereby be moved from an initial position shown here into a contact position which is set back relative to the contact pin 16. In the initial position of the guide sleeve 20, the latter prevents independent radial expansion of the contact segments 18. The radially preloaded contact segments 18 are thereby held compressed in the radial direction by means of the guide sleeve 20 in such a way that their outer diameter is smaller than the inner diameter of the inner contact surface 12 or the inner diameter of the high-current socket 10. The contact pin 16 can thus be inserted into the high-current socket 10 without contact, since the slotted contact segments 18 are held pressed together in the radial direction.

Once the high current contact 14 has been pressed firmly enough onto the high current socket 10, the guide sleeve 20 is moved into the recessed contact position in which the contact segments 18 protrude further from the guide sleeve 20 in the axial direction than in the initial position shown here. In this recessed contact position of the guide sleeve 20, the latter releases an independent radial spreading of the contact segments 18 projecting axially from the guide sleeve 20 for contacting the inner contact surface 12 of the high-current socket 10. The further the guide sleeve 20 is moved from the initial position shown here to the rear, the further this allows radial spreading of the contact segments 18. At the latest when the recessed contact position is reached, the contact segments 18 have spread out so far in the radial direction that they are in contact with the inner contact surface 12 of the high-current socket 10. This ensures reliable electrical contact between the high current contact 14 and the high current socket 10.

For example, the outer diameter of the slotted contact segments 18 may be approximately 12.7 to 13.4 millimeters in the initial position of the guide sleeve 20 as shown herein. When the recessed contact position of the guide sleeve 20 is reached, the contact segments 18 widen in the radial direction, for example, to 15 millimeters. A working stroke of the guide sleeve 20 from the initial position to the retracted contact position may be, for example, 6-7 millimeters.

The radially prestressed slotted contact segments 18 thus act as a type of collet, which can expand or spread radially and independently, when the guide sleeve 20 is pushed back to the high current socket 10 during the pressure of the high current contact 14. The contact segments 18 can be inserted into the high-current socket 10 without damage, since the contact segments 18 do not grind on the inner contact surface 12 of the high-current socket 10 during the insertion process. In particular, wear or damage to the contact segments 18 is prevented, so that the high-current contact 14 can be used for a very large number of mating cycles or test cycles with many high-current sockets 10.

Figure 3:
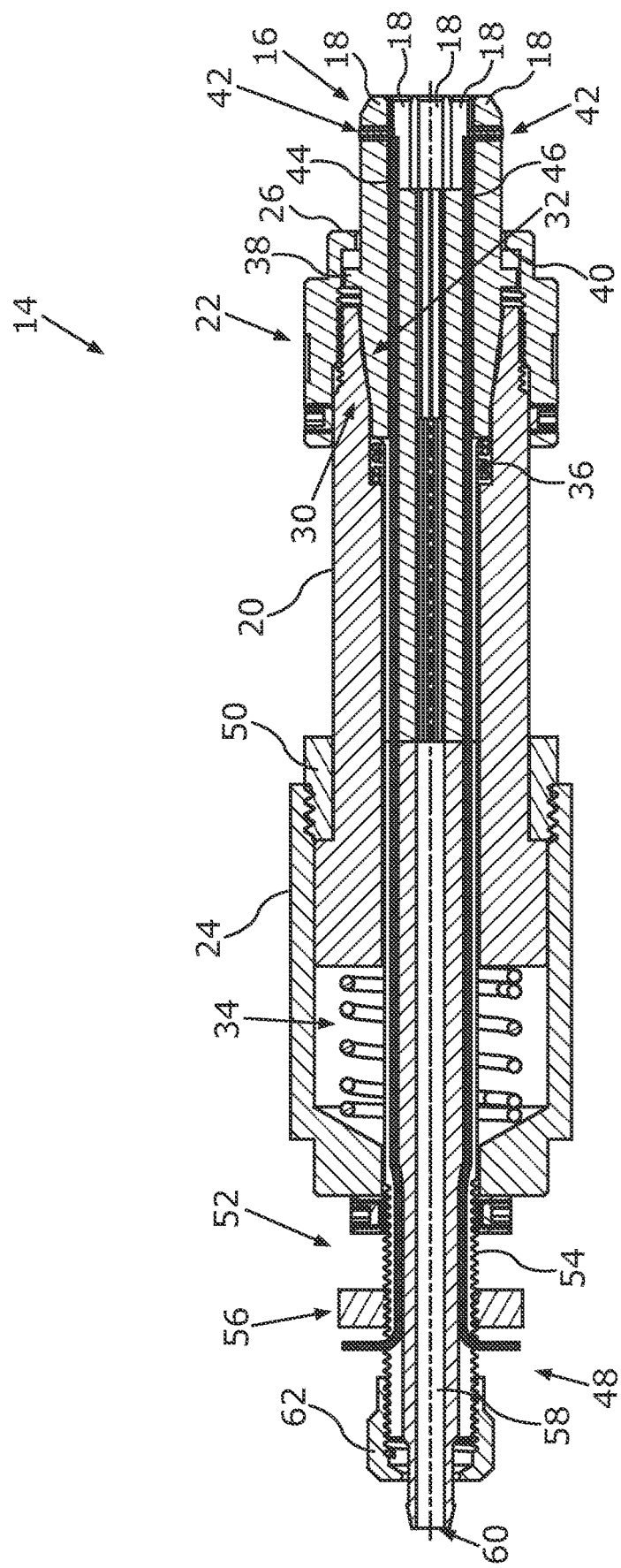
FIG. 3 depicts a side section view of the high-current contact.

In FIG. 3, the high-current contact 14 is shown in a cross-sectional view. The guide sleeve 20 has a conical inner section 30, which interacts with a conical outer section 32 of the contact pin 16 when the guide sleeve 20 is moved from the initial position to the reset contact position, thereby allowing the contact segments 18 to expand independently. The guide sleeve 20 is again shown here in its initial position, in which it blocks independent radial expansion of the contact segments 18 to prevent contact between the contact segments 18 projecting axially from the guide sleeve 20 and the inner contact surface 12 of the high current socket 10. As can be seen, in this initial position the contact segments 18 are aligned parallel to the longitudinal axis of the high-current contact 14.

The guide sleeve 20 is axially movably mounted in the housing part 24 through the intermediary of a return spring 34, which exerts a return force on the guide sleeve 20 in the direction of the initial position. The return spring 34 therefore pushes the guide sleeve 20 to the right according to the present embodiment. Thus, when the high current contact 14 is no longer pressed against the high current socket 10, the return spring 34 automatically ensures that the guide sleeve 20 is displaced to the right, i.e. to its initial position as shown here. The conical inner section 30 and the conical outer section 32 slide along each other accordingly, as a result of which the contact segments 18, which were previously still spread open, are pressed together again in the radial direction. Thus, the contact segments 18 can be pulled out of the high-current socket 10 without grinding on the inner contact surface 12 of the high-current socket 10.

The contact pin 16 is connected to the guide sleeve 20 by means of a spring 36. This spring 36 serves as mechanical protection against overload, for example when a compressive force is applied to the contact pin 16. If, for example, the high-current contact 14 is accidentally pressed onto the front contact surface 28 of the high-current socket 10 during the attempt to introduce the contact pin 16 into the high-current socket 10, the spring 36 can be compressed, as a result, damage to the contact segments 18 can be avoided.

The contact pin 16 has a collar 38 extending radially outwards which prevents movement of the guide sleeve 20 from the reset contact position beyond the initial position. As can be seen, the guide sleeve 20 lies at the front of the collar 38. Thus, the return spring 34 cannot move the guide sleeve 20 beyond the position shown here relative to the contact pin 16.

Opposite the front contact surface 26 of the nut 22 is another contact surface 40. In interaction with the radially outwardly extending collar 38 of the contact pin 16, this contact surface 40 ensures that a displacement of the guide sleeve 20 from the initial position—according to the present embodiment—to the left in the direction of the retracted contact position is limited. By pressing or pressing the high-current contact 14 against the front contact surface 26 of the nut 22 on the front contact surface 28 of the high-current socket 10, the guide sleeve 20 can only be pushed back so far, until the contact surface 40 of the nut 22 comes into contact with the collar 38. It is therefore not possible to overpressure via the recessed contact position. As a result, unintentional spreading of the radially prestressed contact segments 18 is also not possible.

By changing the axial position of the nut 22, the recessed contact position of the guide sleeve 20 and thus the contact force that can be exerted by means of the contact segments 18 on the inner contact surface 12 of the high-current socket 10 can be changed. The nut 22 simply has to be screwed further to the left or to the right according to the present embodiment in order to vary the maximum distance between the contact surface 40 of the nut 22 and the collar 38 of the contact pin. The further the nut 22 is screwed to the right according to the present embodiment, *i.e., in the direction of the free end of the contact pin 16, the further the guide sleeve 20 can be moved away from the free end of the contact pin 16. This can be used to adjust how far the contact segments 18 can expand. Of course, the expansion of the contact segments 18 is limited by the high current socket 10 when the contact segments are inserted into the high current socket 10. The contact force of the contact segments 18 on the inner contact surface 12 can thus be varied by varying the axial positioning of the nut 22**.

Two of the contact segments 18 have a respective bore 42 in their respective contact regions, which can be contacted with the inner contact surface 12 of the high-current socket 10. A test line 44 and 46 for resistance measurement and another test line, not shown in more detail, for temperature measurement, each open at the bore 42. For example, a four-pole measurement or kelvin measurement is possible by means of the test line 44 and 46 in order to measure electrical resistances. Sensor means, for example in the form of kelvin contacts, for four-wire measurement may be integrated in the bores 42, which are not specified here.

The test line for temperature measurement, which is not shown in detail, is used for temperature monitoring during a test procedure when the high-current contact 14 has made electrically conductive contact with the high-current socket 10. A sensor means, for example a temperature sensor, for measuring temperature is arranged in at least one contact region of the contact segments 18.

The test lines 44 and 46 as well as the test line for temperature measurement not shown above and the sensor means not shown here are designed for temperatures higher than 200 degrees. The test lines 44 and 46 and the test line for temperature measurement, which is not shown further, are routed along the contact pin 16 to a longitudinal end 48 remote from the contact segments 18 in respective grooves made specifically for this purpose and not shown further herein.

There, the test lines 44 and 46 and the test line for temperature measurement, which is not shown further, can be connected to a connection not shown here in order to be able to evaluate the resistance measurements and temperature measurements. A higher-level control unit not shown further can be connected to this connection or port. The sensor means for resistance measurement are designed to transmit measurement data representing the resistance measurement via the test lines 44 and 46 to the higher-level control unit. Likewise, the sensor means for temperature measurement is designed to transmit measurement data representing the temperature measurement to the higher-level control unit via the test line for temperature measurement that is not shown further.

A housing closure 50 serves to fix the guide sleeve 20 in the housing part 24 in a radial direction. A lock nut 52 connects the housing part 24 to the contact pin 16, thereby preventing the contact pin 16 from coming loose. A thread 54 on the contact pin 16 thereby receives the lock nut 52. A counter nut 56 is also screwed onto the thread 54. In the axial direction, there is sufficient space between the lock nut 52 and the counter nut 56 to provide, for example, a cable lug together with a cable to ensure an electrical supply to the high-current contact 14.

The contact pin 16 has a coolant bore 58 for supplying a gaseous coolant to the contact segments 18. As mentioned above, very high-currents may flow between the high-current contact 14 and the high-current socket 10 during a test procedure. As a result, the high-current socket 10 and the contact segments 18 can heat up considerably. A connection 60 for supplying the gaseous cooling medium is provided at the longitudinal end 48 remote from the contact segments 18.

For example, a compressed-air hose can be fixed to connection 60 by means of a union nut 62 screwed onto the thread 54. The connection 60 and the coolant bore 58 enable the high-current contact 14, in particular of the contact segments 18, to be cooled, for example by means of compressed air. This serves to reduce the temperature, which is caused by high currents and especially by short cycle times. A series of tests have shown that, already at a pressure of 1 bar of a compressed air supply, the temperature of a contact point, i.e. at the contact segments 18 and the inner contact surface 12 of the high-current socket 10, is reduced by half.

The collet chuck principle of the contact segments 18 achieves a large contact surface which, in combination with the cooling, ensures very good heat dissipation at the high-current contact 14 and also at the high-current socket 10. The explained principle of high-current contact 14 can be used for various high-current sockets 10 with different diameters.

Having described some aspects of the present disclosure in detail, it will be apparent that further modifications and variations are possible without departing from the scope of the disclosure. All matter contained in the above description and shown in the accompanying drawings shall be interpreted as illustrative and not in a limiting sense.

The invention claimed is:

1. A high-current contact for contacting a high-current socket, the high-current contact comprising:
    a contact pin configured for insertion into the high-current socket and comprising a plurality of contact segments slotted in the radial direction configured for contacting an inner contact surface of the high-current socket;
    a guide sleeve arranged to surround the contact pin and which, by pressing at least indirectly on the front face of the high-current socket relative to the contact pin, is configured to be moved in the axial direction from an initial position, in which the guide sleeve blocks independent radial expansion of the contact segments in order to prevent contact between the contact segments projecting axially from the guide sleeve and the inner contact surface, into a contact position which is set back with respect to the contact pin and in which the guide sleeve releases independent radial expansion of the contact segments projecting axially from the guide sleeve in order to contact the inner contact surface;
    a test line configured for measuring at least one physical property opens in at least one contact area of the contact segments; and
    a nut configured to have a front contact surface for the high-current socket, and be screwed onto the guide sleeve, wherein the reset contact position of the guide sleeve is adjusted by axial position change of the nut and thus the contact force which can be exerted on the inner contact surface of the high-current socket can be applied by means of the contact segments.

2. The high-current contact according to claim 1, wherein the guide sleeve comprises a conical inner section which, when the guide sleeve is moved from the initial position to the retracted contact position, interacts with a conical outer section of the contact pin and thereby releases the independent spreading of the contact segments.

3. The high current contact according to claim 1 wherein the guide sleeve is mounted in an axially movable manner in a housing part by means of a return spring which exerts a return force on the guide sleeve in the direction of the initial position.

4. The high-current contact according to claim 1, wherein the contact pin is connected to the guide sleeve by means of a spring (36).

5. The high-current contact according to claim 1, wherein the contact pin has a collar which extends radially outwards and prevents the guide sleeve from moving the reset contact position beyond the initial position.

6. The high current contact according to claim 1, wherein the physical property is at least one of an electrical resistance and a temperature.

7. The high current contact according to claim 1, further comprising:
    a sensor for resistance measuring arranged in at least one contact area of the contact segments and connected to the test line, wherein the sensor is configured to transmit measurement data representing the resistance measurement via the test line) to a superordinate control unit; and
    wherein,
    the test line for measuring resistance opens in at least one contact area of the contact segments.

8. The high current contact according to claim 1, further comprising a sensor for temperature measuring arranged in the at least one contact area of the contact segments and connected to the test line, wherein the sensor is configured to transmit measurement data representing the temperature measurement via the test line to the superordinate control unit or further control unit.

9. The high current contact according to claim 1, further wherein the contact pin has a coolant bore for supplying a gaseous coolant to the contact segments.

10. The high-current contact according to claim 9, wherein the contact pin has, on its longitudinal end remote from the contact segments, a connection for supplying the gaseous cooling medium.

11. The high current contact according to claim 1, wherein the high-current contact comprises a nickel-silver coating.

* * * * *